(12) United States Patent
Shin (10) Patent No.: US 7,881,419 B2
(45) Date of Patent: Feb. 1, 2011

(54) SEMICONDUCTOR DEVICE, SPREAD SPECTRUM CLOCK GENERATOR AND METHOD THEREOF

(75) Inventor: Jong-shin Shin, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 805 days.

(21) Appl. No.: 11/505,360

(22) Filed: Aug. 17, 2006

(65) Prior Publication Data

US 2007/0041486 A1 Feb. 22, 2007

(30) Foreign Application Priority Data

Aug. 18, 2005 (KR) ...................... 10-2005-0075674

(51) Int. Cl.
*H03D 3/24* (2006.01)
(52) U.S. Cl. ..................... 375/376; 375/327; 375/373; 455/260; 327/156
(58) Field of Classification Search ................. 375/327, 375/373, 376; 327/156; 455/260
See application file for complete search history.

(56) References Cited

U.S. PATENT DOCUMENTS

| 4,733,197 | A | * | 3/1988 | Chow | ......................... | 331/1 A |
| 5,059,924 | A | * | 10/1991 | JenningsCheck | ............ | 331/1 A |
| 6,542,013 | B1 | * | 4/2003 | Volk et al. | ................... | 327/115 |
| 6,606,004 | B2 | | 8/2003 | Staszewski | | |
| 7,187,241 | B2 | * | 3/2007 | Hein et al. | ..................... | 331/16 |
| 2003/0198311 | A1 | | 10/2003 | Song et al. | | |

(Continued)

FOREIGN PATENT DOCUMENTS

JP 2004-206696 7/2004

(Continued)

OTHER PUBLICATIONS

Korean Office Action dated Sep. 29, 2006 for corresponding Korean Application No. 10-2005-0075674.

(Continued)

*Primary Examiner*—Ted M Wang
(74) *Attorney, Agent, or Firm*—Harness, Dickey & Pierce, P.L.C.

(57) ABSTRACT

A semiconductor device, a spread spectrum clock generator and method thereof are provided. The example semiconductor device may include a frequency dividing unit receiving an output signal, generating a first feedback signal and a second feedback signal by dividing a frequency of the received output signal, and a phase offset unit outputting the output signal having a predetermined or desired phase difference with a reference signal in response to the second feedback signal, wherein the second feedback signal having a higher frequency than the first feedback signal. The example spread spectrum clock generator may include a plurality of frequency dividers which are connected in series and a selector selecting and outputting one of a plurality of output signals, each of the plurality of output signals having a different phase difference with respect to a reference signal, in response to at least one output from one or more of the plurality of frequency dividers. The example method may include receiving a reference signal with a first frequency, generating a feedback signal having a second frequency, the second frequency higher than the first frequency and outputting at least one of a sequentially selected set of output signals in response to the generated feedback signal.

31 Claims, 3 Drawing Sheets

U.S. PATENT DOCUMENTS

2004/0222856 A1    11/2004    Hein et al.

FOREIGN PATENT DOCUMENTS

| KR | 10-2000-0026476 A | 5/2000 |
| KR | 1020040073128 A | 8/2004 |
| TW | 200516369 | 5/2005 |

OTHER PUBLICATIONS

Preliminary Notice of First Office Action issued by the Taiwanese Patent Office on Nov. 17, 2009.

Chinese Office Action dated Mar. 12, 2010 for Chinese Patent Application No. 200610163938.0 with English Translation.

* cited by examiner

A: (1.5G−4.53083)   delto: (−5.6/692M−22.7501)
B: (1.49432G−27.2809)   slope: 4.00746u

US 7,881,419 B2

SEMICONDUCTOR DEVICE, SPREAD SPECTRUM CLOCK GENERATOR AND METHOD THEREOF

PRIORITY STATEMENT

This application claims the priority of Korean Patent Application No. 10-2005-0075674, filed on Aug. 18, 2005, in the Korean Intellectual Property Office, the disclosure of which is incorporated herein in its entirety by reference.

BACKGROUND OF THE INVENTION

1. Field of the Invention

Example embodiments of the present invention relate generally to a semiconductor device, a spread spectrum clock generator and method thereof and more particularly to a semiconductor device, a spread spectrum clock generator and method of outputting signals.

2. Description of the Related Art

Increases in the operating speed of systems may cause an increase the speed at which data may be processed. Generally, to increase a data processing speed, a clock signal frequency may be increased. However, higher-frequency clock signals may contain a harmonic component. The harmonic component included in higher-frequency clock signals may cause electromagnetic waves which, in some cases, may be harmful to the human body. Conventionally, a shielding device (e.g., a capacitor) may be used to reduce the electromagnetic waves generated by the system, but such shielding devices may be limited with respect to a degree to which they may reduce the electromagnetic waves. Another conventional manner of reducing the energy of electromagnetic waves may be lowering the energy of harmonic component.

A phase-locked loop (PLL) may be used to generate a clock signal. A PLL may generate a modulated clock signal, alternatively referred to as a spread spectrum signal, to lower the energy of harmonics contained in the clock signal.

A phase modulation process and a frequency modulation process are examples of two conventional processes of generating a modulated clock signal using a PLL. The phase modulation method may use sigma-delta modulation in which the energy of an electromagnetic wave may be lowered by modulating a difference between phases of an input reference frequency and a feedback frequency with a sigma-delta modulation block of the PLL, and finely adjusting a current with a charge pump block of the PLL.

In the frequency modulation process, the energy of an electromagnetic wave may be reduced by using the phase locking range of a PLL circuit with a multi-stage counter or a read-only memory (ROM) while feeding back a frequency generated by a voltage-controlled oscillator (VCO) of a PLL.

Figure 1:
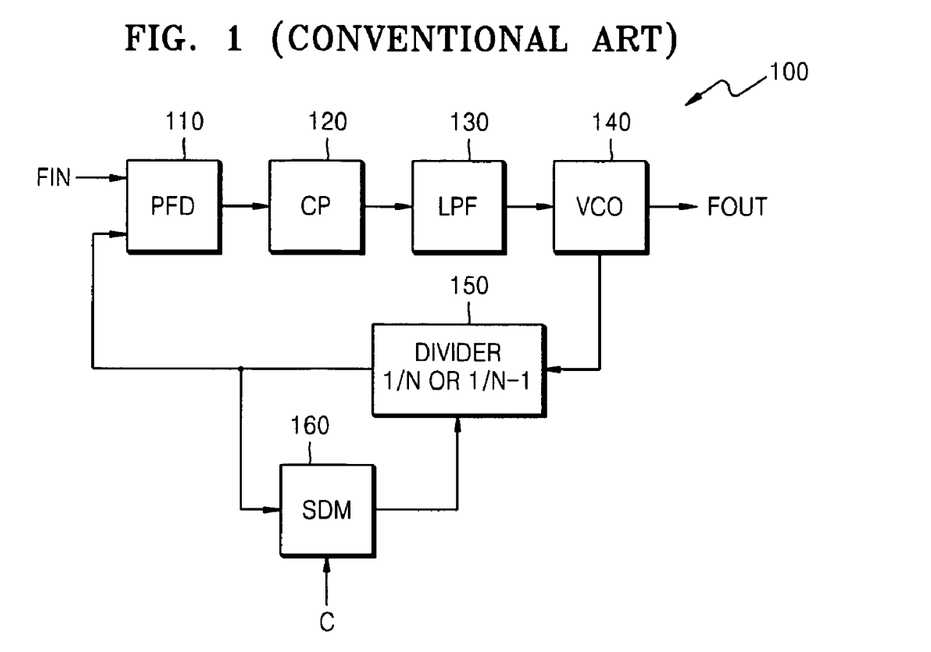
FIG. 1 is a block diagram illustrating a conventional spread spectrum clock generator.

FIG. 1 is a block diagram of a conventional spread spectrum clock generator 100. Referring to FIG. 1, the spread spectrum clock generator 100 may include a phase detector 110, a charge pump 120, a low-pass filter 130, a VCO 140, a frequency divider 150 that divides the frequency of a signal output from the VCO 140, and a sigma-delta modulator 160 that controls the operation of the frequency divider 150.

Referring to FIG. 1, the sigma-delta modulator 160 may receive a feedback signal output from the frequency divider 150 and may control a division ratio of the frequency divider 150 in response to a control signal C. For example, the sigma-delta modulator 160 may set the division ratio of the frequency divider 150 to N if a clock signal is set to a higher level (e.g., above a higher frequency threshold) and may set the division ratio to N−1 if the clock signal is to a lower level (e.g., below a lower frequency threshold).

Referring to FIG. 1, by using the sigma-delta modulator 160, the division ratio used to divide the frequency of the signal output from the VCO 140 may be adjusted to a non-integer, and a feedback signal that is phase-delayed by a cycle of the signal output from the VCO 140 may be supplied to the phase detector 110. However, if the division ratio of the VCO 140 is adjusted as described above, a signal phase-delayed by a relatively large amount (e.g., corresponding to a cycle of the signal output from the VCO 140) may be supplied to the phase detector 140, thereby increasing jitter in a spread spectrum clock signal FOUT.

Figure 2:
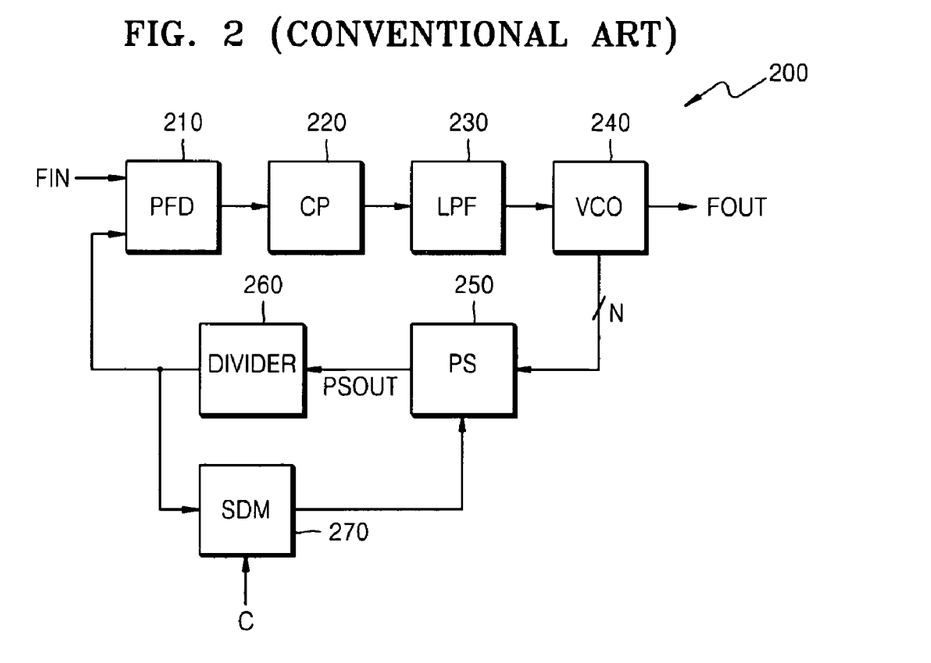
FIG. 2 is a block diagram illustrating another conventional spread spectrum clock generator.

FIG. 2 is a block diagram of another conventional spread spectrum clock generator 200. Referring to FIG. 2, the spread spectrum clock generator 200 may include a phase detector 210, a charge pump 220, a low-pass filter 230, a VCO 240, a selector 250 that may select one of a plurality of signals that may be output from the VCO 240, each of the plurality of signals having given phase differences, a frequency divider 260 that divides the frequency of a signal PSOUT output from the selector 250, and a sigma-delta modulator 270 that controls the operation of the selector 250.

Referring to FIG. 2, the VCO 240 may be a multi-phase VCO that generates a plurality of output signals, each having phase differences with respect to one another. One of the plurality of output signals may be selected (e.g., by the selector 250) for output as the spread spectrum clock signal FOUT.

Figure 3:
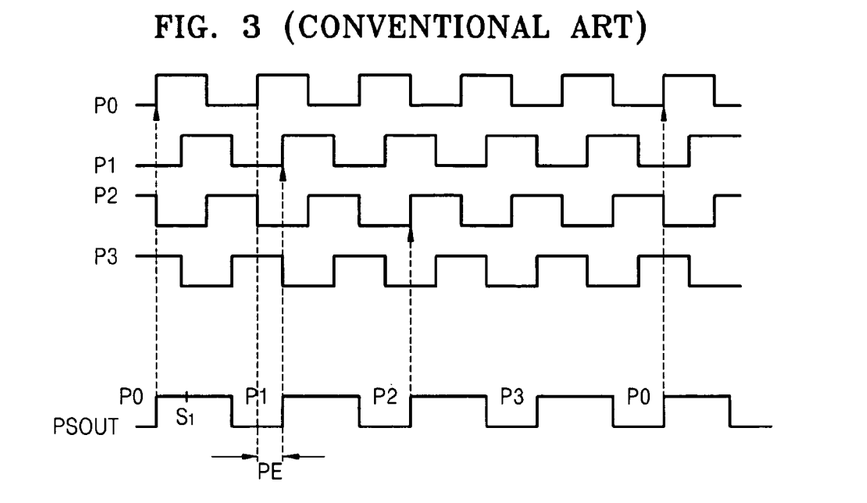
FIG. 3 is a timing diagram of signals output from a voltage-controlled oscillator (VCO) of the spread spectrum clock generator of FIG. 2.

FIG. 3 is a timing diagram for signals output from the spread spectrum clock generator 200 of FIG. 2. The sigma-delta modulator 270 of the spread spectrum clock generator 200 may receive a signal from the frequency divider 260, and may control the selector 250 to sequentially output a plurality of signals received from the VCO 240, or alternatively may continually output one of the signals received from the VCO 240 in response to a control signal C.

Referring to FIG. 3, if the selector 250 selects and outputs signals P0 through P3, a signal PSOUT phase-delayed by a time period PE from each of the signals P0 through P3 may be output from the selector 250.

Unlike the spread spectrum clock generator 100 of FIG. 1, the spread spectrum clock generator 200 of FIG. 2 may reduce jitter in a spread spectrum clock signal FOUT by supplying a feedback signal having different phase delays to the phase detector 210, rather than changing the division ratio of the frequency divider 260. Generally, the greater the number of signals output from the VCO 240, the smaller the difference of the phase delay of the feedback signal supplied to the phase detector 210.

Further, to reduce fabrication costs, a reference signal FIN with a lower frequency may be used, and the division ratio of the frequency divider 260 may thereby have to be increased to obtain higher-frequency clock signals. Therefore, the number of signals output from the VCO 240 to generate the spread spectrum clock signal FOUT may be increased. However, in general, a number of signals output from the VCO 240 may be relatively limited.

In order to increase a frequency offset of the spread spectrum clock signal FOUT, the sigma-delta modulator 270 may select a plurality of signals, sequentially at each clock signal, for the reference signal FIN. If the frequency of the reference signal FIN is Fr and the number of signals with a given phase difference output from the VCO 240 is N, a maximum possible frequency offset may be Fr/N.

The frequency offset may denote a frequency range within which the spread spectrum clock signal FOUT may fall. For example, if the frequency of the spread spectrum clock signal FOUT is configured for 1500 megahertz (MHz) and the frequency offset is 5%, the frequency of the spread spectrum clock signal FOUT may fluctuate between 1425 MHz (i.e., 1500 minus 5%) through 1500 MHz.

For example, in order to obtain a frequency offset ratio of 0.5%, if the frequency of the reference signal FIN is 25 MHz and the frequency of the spread spectrum clock signal FOUT is configured for 1500 MHz, N may equal 3.33 because the frequency offset may be denoted by 25/N and the frequency offset ratio may thereby be 25/N/1500=0.005. However, N may need to equal a natural number, i.e., N=3. Accordingly, if more than three signals having different phases are output from the VCO 240, it may be difficult or impossible to obtain a maximum possible frequency modulation ratio of 0.5% using the above-described conventional process.

In another conventional process, if more than three signals are generated by the VCO 240, the selector 250 may select three of the signals randomly (i.e., not sequentially) while bypassing or skipping certain signals, to reduce jitter in the spread spectrum clock signal FOUT. The selector 250 may supply the randomly selected signals to the frequency divider 260. For example, the selector 250 may not sequentially select the output signals P0 through P3 illustrated in FIG. 3, but instead may select the output signal P2 after the output signal P0. Alternatively, in another example, the selector 250 may select the output signal P3 after the output signal P1.

However, in the spread spectrum clock generator 200, the signals having a fixed phase difference may not be supplied as feedback signals to the phase detector 210. Instead, the signals having an adjusted phase difference may be supplied, thereby complicating a circuit logic and operation thereof.

SUMMARY OF THE INVENTION

An example embodiment of the present invention is directed to a semiconductor device, including a frequency dividing unit receiving an output signal, generating a first feedback signal and a second feedback signal by dividing a frequency of the received output signal, and a phase offset unit outputting the output signal having a predetermined or desired phase difference with a reference signal in response to the second feedback signal, wherein the second feedback signal having a higher frequency than the first feedback signal.

Another example embodiment of the present invention is directed to a spread spectrum clock generator, including a plurality of frequency dividers which are connected in series and a selector selecting and outputting one of a plurality of output signals, each of the plurality of output signals having a different phase difference with respect to a reference signal, in response to at least one output from one or more of the plurality of frequency dividers.

Another example embodiment of the present invention is directed to a method of outputting signals, including receiving a reference signal with a first frequency, generating a feedback signal having a second frequency, the second frequency higher than the first frequency and outputting at least one of a sequentially selected set of output signals in response to the generated feedback signal.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Example embodiments of the present invention are described more fully hereinafter with reference to the accompanying drawings, in which example embodiments of the present invention are shown. Example embodiments of the present invention may, however, be embodied in many different forms and should not be construed as limited to the example embodiments set forth herein. Rather, these example embodiments are provided so that this disclosure will be thorough and complete, and will fully convey the scope of the invention to those skilled in the art. Like numbers refer to like elements throughout.

It will be understood that although the terms first and second are used herein to describe elements and should not be limited by these terms. These terms are used to distinguish one element from another. Thus, a first element discussed below could be termed a second region, layer or section, and similarly, a second element may be termed a first element without departing from the teachings of the present invention.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
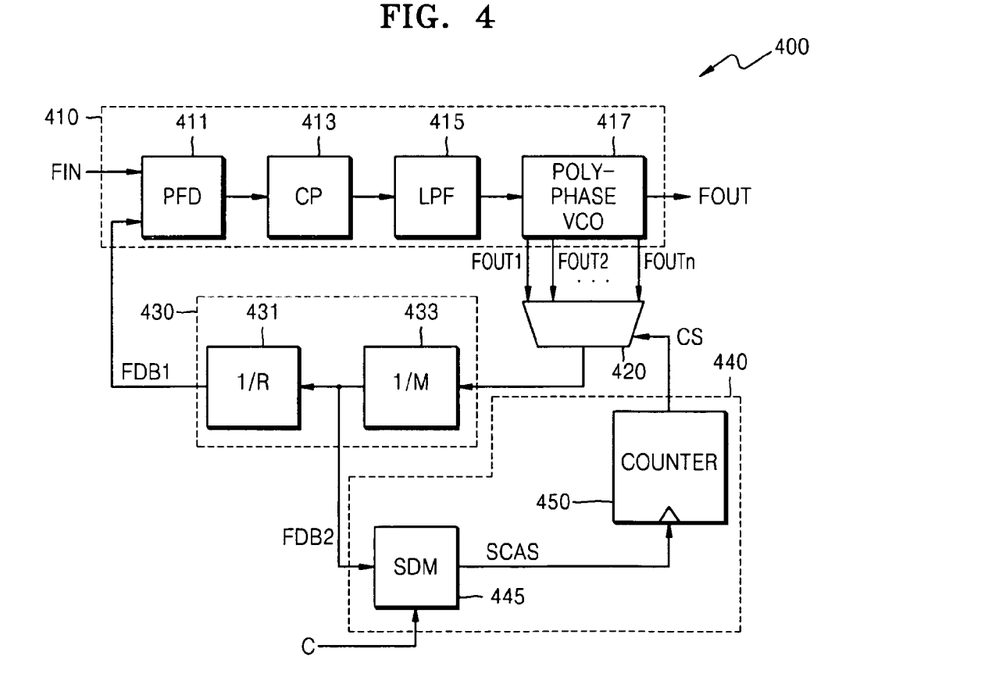
FIG. 4 is a block diagram of a spread spectrum clock generator according to an example embodiment of the present invention.

FIG. 4 is a block diagram of a spread spectrum clock generator 400 according to an example embodiment of the present invention. In the example embodiment of FIG. 4, the spread spectrum clock generator 400 may include a phase-locked loop (PLL) 410, a selector 420, a frequency-dividing unit 430, and a controller 440.

In the example embodiment of FIG. 4, the PLL 410 may generate a plurality of output signals FOUT1 through FOUTn having fixed phase differences from a reference signal FIN. The PLL 410 may include a phase detector 411 that detects the phase difference between a reference signal FIN and a first feedback signal FDB1, a charge pump 413 that supplies or sinks an electric charge in response to a signal output from the phase detector 411, a low-pass filter 415 that low-pass filters a signal output from the charge pump 413 to generate a DC-controlled voltage, and a multi-phase VCO 417 that generates a plurality of output signals FOUT1 through FOUTn in response to the DC-controlled voltage.

In the example embodiment of FIG. 4, the selector 420 may select and output one of the signals FOUT1 through FOUTn in response to a count signal CS. In an example, the selector 420 may be a multiplexer. The frequency-dividing unit 430 may generate a first feedback signal FDB1 by dividing a frequency of the signal received from the selector 420, and may output the first feedback signal FDB1 to the PLL 410.

In the example embodiment of FIG. 4, the controller 440 may receive a second feedback signal FDB2 with a frequency R times the frequency of the reference signal FIN, wherein R may be an integer, and may generate the count signal CS in response to a control signal C.

In the example embodiment of FIG. 4, an interval at which the selector 420 selects one of the output signals FOUT1 through FOUTn may be shorter than an interval of the reference signal FIN. In an example, the selector 420 may sequentially select (e.g., without skipping or bypassing) the output signals FOUT1 through FOUTn. Therefore, the construction of the selector 420 may be relatively simplified, thereby reducing jitter. In other words, the spread spectrum clock generator 400 need not bypass output signals (e.g., as in the conventional process of randomly selecting certain signals and bypassing others).

In the example embodiment of FIG. 4, if the controller 440 operates at a frequency R times the frequency Fr of the reference signal FIN, and not at each cycle of the reference signal FIN, a maximum possible frequency offset with respect to the number of the output signals FOUT1 through FOUTn may be denoted as Fr×R/n. Accordingly, the output signals FOUT1 through FOUTn (e.g., with a reduced phase difference) may be supplied to the phase detector 411 of the PLL 410, thereby reducing jitter therein.

In the example embodiment of FIG. 4, the controller 440 may include a sigma-delta modulator 445 and a counter 450. The sigma-delta modulator 445 may operate in synchronization with the second feedback signal FDB2 and may generate a scale control signal SCAS in response to the control signal C. The counter 450 may generate the count signal CS in response to the scale control signal SCAS. The frequency dividing unit 430 may include at least two frequency dividers that are connected in series to divide the frequency of a signal output from the selector 420. In order to operate the sigma-delta modulator 445 of the controller 440 at a frequency higher than the frequency Fr of the reference signal FIN, the frequency-dividing unit 430 may include the at least two frequency dividers that are connected in series to divide the frequency of a signal output from the selector 420. One of a plurality of signals output from the at least two frequency dividers may be selected as the second feedback signal FDB2 and output to the sigma-delta modulator 445.

In the example embodiment of FIG. 4, the frequency-dividing unit 430 may include a first frequency divider 433 and a second frequency divider 431. The first frequency divider 433 may divide the frequency of the signal received from the selector 420 by a division ratio of M (e.g., wherein M may be an integer), and the second frequency divider 431 may divide the frequency of a signal received from the first frequency divider 433 by a division ratio of R (e.g., wherein R may be an integer). Thus, a division ratio K of the frequency-dividing unit 430 may be the product of R and M.

In the example embodiment of FIG. 4, the second feedback signal FDB2 operating the sigma-delta modulator 445 may be output from the first frequency divider 433. The frequency of the second feedback signal FDB2 may be R times the frequency of the first feedback signal FDB1 supplied to the phase detector 411. Because the first feedback signal FDB1 may be configured to have substantially the same phase as the reference signal FIN, the frequency of the second feedback signal FDB2 may be R times the frequency of the reference signal FIN.

In an example, referring to FIG. 4, assuming that the reference signal FIN has a frequency of 25 kilohertz (KHz) and R is 4, the second feedback signal FDB2 may have a frequency of 100 MHz. The sigma-delta modulator 445 may operate in synchronization with the second feedback signal FDB2 and may generate the scale control signal SCAS in response to the control signal C. The control signal C may be used to externally control the sigma-delta modulator 445, and the waveform of a spread spectrum clock signal FOUT output from the multi-phase VCO 417 may be equalized with the waveform of the control signal C. The sigma-delta modulator 445 may generate the scale control signal SCAS at each cycle of the second feedback signal FDB2 (e.g., at a frequency of 100 MHz). In a further example, the scale control signal SCAS may be a clock signal that may alternate between a first logic level (e.g., a higher logic level or logic "1") and a second logic level (e.g., a lower logic level or logic "0").

In the example embodiment of FIG. 4, the counter 450 may maintain the value of the count signal CS if the scale control signal SCAS is set to the first logic level (e.g., a higher logic level or logic "1"), and may decrement the value of the count signal CS (e.g., by one) if the scale control signal SCAS is set to the second logic level (e.g., a lower logic level or logic "0"). At each decrement or countdown of the count signal CS, the selector 420 may sequentially select and output a number of the output signals FOUT1 through FOUTn.

Referring again to FIG. 2, the conventional sigma-delta modulator 270 may generate a signal for controlling the selector 250 at each cycle of the reference signal FIN, whereas the sigma-delta modulator 445 of the example embodiment of FIG. 4 may generate the scale control signal SCAS at each cycle of a signal having a frequency R times the frequency of the reference signal FIN.

Returning to the example embodiment of FIG. 4, the scale control signal SCAS may be generated at a given frequency (e.g., 100 MHz), which may be substantially equal to the frequency of the second feedback signal FDB2, and the counter 450 may generate the count signal CS based on a logic level of the scale control signal SCAS. Thus, the selector 420 may sequentially select and output the output signals FOUT1 through FOUTn at the given frequency (e.g., 100 MHz).

Again referring to FIG. 2, the conventional spread spectrum clock generator 200 may output the output signal PSOUT from the selector 250 at a lower frequency (e.g., 25 MHz) which may be substantially equal to the frequency of the reference signal FIN, whereas the spread spectrum clock generator 400 of the example embodiment of FIG. 4 may sequentially select and output a plurality of the output signals FOUT1 through FOUTn, via selector 420, at a higher frequency (e.g., 100 MHz) during a cycle of the reference signal FIN, which may be set to the lower frequency (e.g., 25 MHz).

Thus, a number of the output signals FOUT1 through FOUTn used by the spread spectrum clock generator 400 may be greater than the number of the output signals used by the conventional spread spectrum clock generator 200, and further, the phase difference between the output signals FOUT1 through FOUTn may be less than the phase difference between output signals P0 through P3 of the spread spectrum clock generator 200. Therefore, jitter in the spread spectrum clock signal FOUT output from the spread spectrum clock generator 400 may be reduced.

Returning to the example embodiment of FIG. 4, the frequency-dividing unit 430 may include a plurality of frequency dividers (e.g., at least two) that may be connected in series, and the sigma-delta modulator 445 may operate in response to one of the signals output from the plurality frequency dividers, thereby simplifying a construction of the spread spectrum clock generator 400. The spread spectrum clock generator 400 may further include a phase interpolator (not shown) and/or a phase blender (not shown), each of which may be positioned between the PLL 410 and the selector 420 and each of which may generate output signals having a fixed phase difference in response to the output signals FOUT1 through FOUTn. In a further example, the phase interpolator and/or the phase blender may increase a number of output signals generated by the multi-phase VCO 417.

Figure 5A:
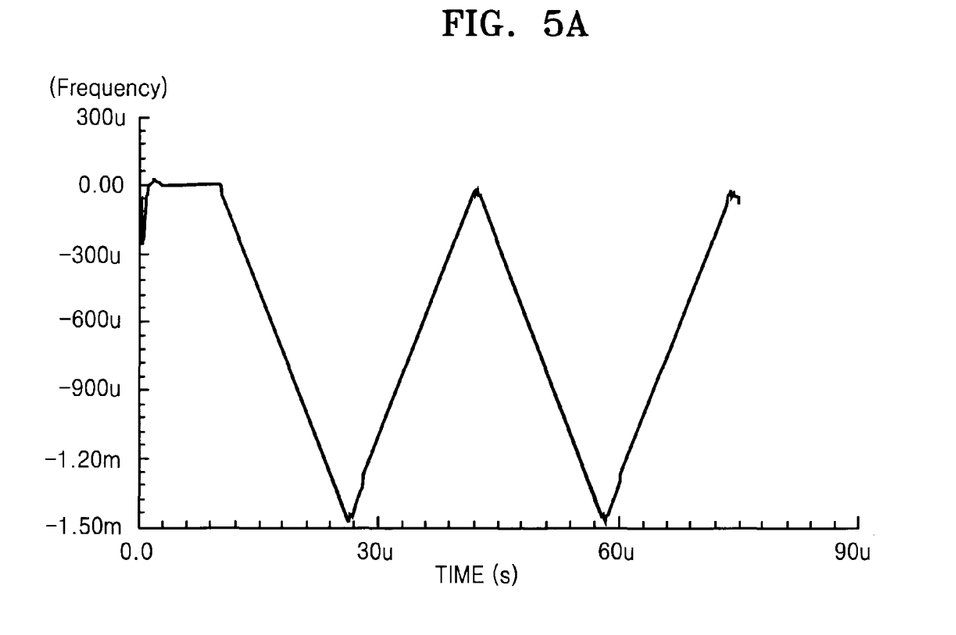
FIG. 5A is a graph illustrating a spread spectrum clock signal output by the spread spectrum clock generator of FIG. 4 according to another example embodiment of the present invention.

FIG. 5A is a graph illustrating the spread spectrum clock signal FOUT of FIG. 4 according to an example embodiment of the present invention. In particular, FIG. 5A is a graph of frequency versus time for the spread spectrum clock signal FOUT of FIG. 4. As shown in the example embodiment of FIG. 5A, the spread spectrum clock signal FOUT may form a triangular wave with relatively small ripples.

Figure 5B:
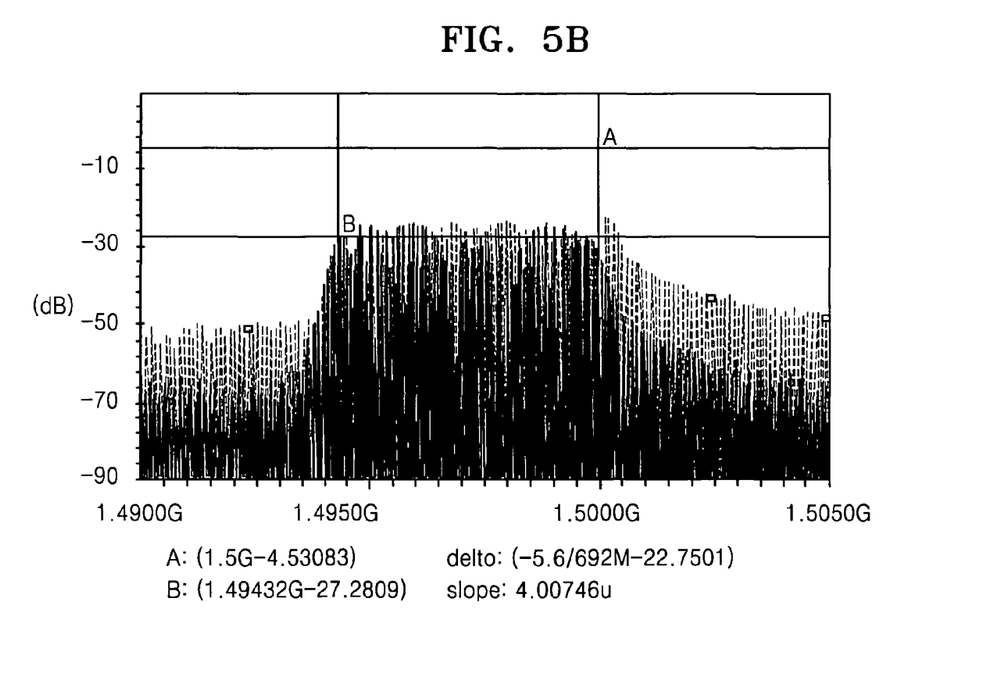
FIG. 5B is an energy spectrum of the spread spectrum clock signal of FIG. 5A according to another example embodiment of the present invention.

FIG. 5B illustrates the energy spectrum of the spread spectrum clock signal FOUT of FIG. 5 according to another example embodiment of the present invention. As shown in the example embodiment of FIG. 5B, the energy spectrum of the spread spectrum clock signal FOUT may have a peak at a point B that may be lower (e.g., 22 dB lower) than a peak at a point A where no spread spectrum is generated.

In a first alternative example embodiment of the present invention, a spread spectrum clock generator may include a shifting unit, a frequency divider, a PLL, and a counter. The shifting unit may shift an output signal by a given phase (e.g., a fixed amount) and may output the shifted signal by a frequency of P in response to a count signal (e.g., wherein P may be an integer). The frequency divider may generate a feedback signal by dividing the frequency of the shifted signal, received from the shifting unit, by K.

In the first alternative example embodiment of the present invention, the PLL may compare the phases of the feedback signal and a reference signal and may generate the output signal based on the comparison result. The counter may generate the count signal in synchronization with a signal having a frequency of P. In an example, the frequency of P may be R times the frequency of the reference signal (e.g., wherein R may be an integer).

In the first alternative example embodiment of the present invention, the spread spectrum clock generator may further include a sigma-delta modulator that may operate in synchronization with a signal having a frequency that may be R times the frequency of the reference signal and may generate a signal having a frequency of P in response to a control signal.

In the first alternative example embodiment of the present invention, the spread spectrum clock generator may control the shifting unit by using the sigma-delta modulator. The sigma-delta modulator may generate the signal having the frequency of P in synchronization with the signal with a frequency R times the frequency of the reference signal. The shifting unit may shift an output signal by a given phase (e.g., a fixed amount) and may output the shifted signal based on a frequency of P.

In the first alternative example embodiment of the present invention, the operation of the shifting unit may be similar to that of the selector 420 of the spread spectrum clock generator 400 of FIG. 4, and the frequency divider, the PLL, the counter, and the sigma-delta modulator may likewise correspond to the frequency-dividing unit 430, the PLL 410, the counter 450, and the sigma-delta modulator 445 of FIG. 4, respectively. Accordingly, a further detailed description of the above elements will be omitted for the sake of brevity.

In a second alternative example embodiment of the present invention, a frequency synthesizer may include a clock generator, a selector, a frequency divider, and a counter. The clock generator may receive a reference signal and may generate a plurality of output signals having given phase differences (e.g., separated by fixed amounts) from the reference signal.

In the second alternative example embodiment of the present invention, the selector may select and output the output signals according to a frequency of P in response to a count signal (e.g., wherein P may be an integer). The frequency divider may generate a feedback signal by dividing the frequency of a signal received from the selector by K (e.g., wherein K may be an integer). The counter may generate the count signal in synchronization with a signal having a frequency of P. In an example, P may be R times the frequency of the reference signal (e.g., wherein R may be an integer).

In the second alternative example embodiment of the present invention, the frequency synthesizer may further include a sigma-delta modulator that may operate in synchronization with a signal having a frequency R times the frequency of the reference signal and may control the counter to generate the count signal according to a frequency of P in response to a control signal.

In the second alternative example embodiment of the present invention, the operation of the clock generator may be similar to that of the PLL 410 of FIG. 4. The selector, the frequency divider, the counter, and the sigma-delta modulator may likewise correspond to the selector 420, frequency-dividing unit 430, the counter 450, and the sigma-delta modulator 445 of FIG. 4, respectively. Accordingly, a further detailed description of the above elements will be omitted for the sake of brevity.

In a third alternative example embodiment of the present invention, a frequency synthesizer may include a PLL, a selector, a frequency divider, a sigma-delta modulator, and a counter. The PLL may generate a plurality of output signals having given phase differences (e.g., separated by fixed amounts) from a reference signal. The selector may sequentially select and output the output signals in response to a count signal. The frequency divider may generate a feedback signal by dividing the frequency of an output signal received from the selector by K, and may supply the feedback signal to the PLL.

In the third alternative example embodiment of the present invention, the sigma-delta modulator may operate in synchronization with a signal having a frequency higher than the frequency of the reference signal and may generate a clock signal in response to a control signal. The counter may generate the count signal in response to the clock signal.

In the third alternative example embodiment of the present invention, the PLL, the selector, the frequency divider, the counter, and the sigma-delta modulator may correspond to the PLL 410, the selector 420, the frequency-dividing unit 430, the counter 450, and the sigma-delta modulator 445, respectively, and as such a more detailed description thereof will be omitted for the sake of brevity.

As described in the above example embodiments of the present invention, a spread spectrum clock generator may generate a spread spectrum clock signal by increasing a number of signals to be output from a multi-phase VCO (e.g., per clock cycle), thereby reducing jitter in the spread spectrum clock signal, and further, a modulation ratio may not be limited. Further, an operating speed of a sigma-delta modulator may be allowed to increase without the inclusion of additional, complicated control logic.

Example embodiments of the present invention being thus described, it will be obvious that the same may be varied in many ways. For example, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:

1. A semiconductor device, comprising:
   a frequency dividing unit receiving an output clock signal, generating a first feedback clock signal and a second feedback clock signal by dividing a frequency of the received output clock signal; and
   a phase offset unit outputting the output clock signal which is selected among a plurality of output clock signals having a different phase difference with respect to a reference clock signal in response to the second feedback clock signal, wherein
   the second feedback clock signal has a higher frequency than the first feedback clock signal and a lower frequency than the output clock signal, and
   the phase offset unit selects and outputs one of the plurality of output clock signals at a lower frequency than that of the plurality of output clock signals.

2. A spread spectrum clock generator, comprising:
   the semiconductor device of claim 1,
   wherein the phase offset unit includes a phase-locked loop generating the plurality of output clock signals, each of the plurality of output clock signals having a phase difference from the reference clock signal and a selector selecting one of the output clock signals in response to a count signal, the selected output clock signal being the output clock signal received by the frequency dividing unit.

3. The spread spectrum clock generator of claim 2, further comprising:
   a controller generating the count signal in response to the second feedback clock signal, the second feedback clock signal having a higher frequency than the reference clock signal.

4. The spread spectrum clock generator of claim 3, wherein the second feedback clock signal has a frequency which is R times a frequency of the reference clock signal, wherein R is an integer.

5. The spread spectrum clock generator of claim 3, wherein the controller includes:
   a sigma-delta modulator operating in synchronization with the second feedback clock signal and generating a scale control signal in response to a control signal; and
   a counter generating the count signal in response to the scale control signal.

6. The spread spectrum clock generator of claim 5, wherein the counter maintains the value of the count signal if the scale control signal is at a first logic level, and decrements the count signal if the scale control signal is at a second logic level.

7. The spread spectrum clock generator of claim 6, wherein the selector sequentially selects and outputs at least one of the plurality of output clock signals if the value of the count signal is decremented.

8. The spread spectrum clock generator of claim 4, wherein the first feedback clock signal is obtained by dividing a frequency of the selected output clock signal output from the selector by K, where K is an integer, and K is greater than R.

9. The spread spectrum clock generator of claim 8, wherein the frequency dividing unit includes at least two frequency dividers which are connected in series, where a product of division ratios of the respective frequency dividers is K, and the second feedback clock signal is one of a plurality of clock signals output from the frequency dividers.

10. The spread spectrum clock generator of claim 9, wherein the frequency dividing unit includes:
    a first frequency divider dividing the frequency of the selected output clock signal received from the selector by M, where M is an integer; and
    a second frequency divider dividing the frequency of an output clock signal received from the first frequency divider by R, where R is an integer,
    wherein K is a product of R and M, and
    the second feedback clock signal is output from the first frequency divider.

11. The spread spectrum clock generator of claim 2, further comprising:
    one of a phase interpolator and a phase blender positioned between the phase-locked loop and the selector and generating another plurality of output clock signals having a fixed phase difference in response to the plurality of output clock signals generated by the phase-locked loop.

12. The spread spectrum clock generator of claim 2, wherein the phase-locked loop includes:
    a phase detector detecting a phase difference between the reference clock signal and the first feedback clock signal;
    a charge pump either supplying or sinking an electric charge in response to a signal received from the phase detector;
    a lower-pass filter generating a direct-current controlled voltage by lower-pass filtering a signal received from the charge pump; and
    a multi-phase voltage-controlled oscillator generating the plurality of output clock signals in response to the direct-current controlled voltage.

13. A spread spectrum clock generator, comprising:
    the semiconductor device of claim 1; and
    a counter generating a count signal in synchronization with a signal having a frequency of P,
    wherein the phase offset unit includes a phase-locked loop comparing the phases of the first feedback clock signal and the reference clock signal and generating the output clock signal based on the comparison result and a shifting unit shifting the output clock signal by a fixed phase and outputting the shifted clock signal according to the frequency of P in response to a count signal, wherein the frequency dividing unit generates the first feedback clock signal by dividing the frequency of a clock signal received from the shifting unit by K, where K is an integer, and wherein P is R times the frequency of the reference clock signal.

14. The spread spectrum clock generator of claim 13, further comprising:

a sigma-delta modulator operating in synchronization with a frequency clock signal whose frequency is P, and generating the signal having the frequency of P in response to a control signal.

15. The spread spectrum clock generator of claim 14, wherein the frequency clock signal is obtained from the shifted output clock signal.

16. The spread spectrum clock generator of claim 14, wherein the frequency dividing unit includes at least two frequency dividers which are connected in series in order to divide the frequency of the clock signal received from the shifting unit, where the product of division ratios of the frequency dividers is K, and the frequency clock signal is one of a plurality of clock signals output from the frequency dividers.

17. The spread spectrum clock generator of claim 13, wherein the shifting unit is a multiplexer.

18. A frequency synthesizer, comprising:

the semiconductor device of claim 1, the phase offset unit including a clock generator receiving the reference clock signal and generating a plurality of output clock signals having fixed phase differences from the reference clock signal and a selector sequentially selecting and outputting at least one output clock signal according to a frequency of P in response to a count signal, where P is an integer, and the frequency dividing unit generating the first feedback clock signal by dividing the frequency of a clock signal received from the selector by K; and a counter generating the count signal in synchronization with a signal having a frequency of P, wherein P is R times the frequency of the reference clock signal, where R and K are integers.

19. The frequency synthesizer of claim 18, further comprising:

a sigma-delta modulator operating in synchronization with a frequency clock signal whose frequency is R times the frequency of the reference clock signal, and controlling the counter to generate the count signal according to a frequency of P in response to a control signal.

20. The frequency synthesizer of claim 19, wherein the frequency clock signal is obtained from the selected at least one output clock signal output from the selector.

21. The frequency synthesizer of claim 19, wherein the frequency dividing unit includes:

at least two frequency dividers which are connected in series in order to divide the frequency of the clock signal received from the selector, where the product of division ratios of the two frequency dividers is K, and wherein the frequency clock signal is one of a plurality of clock signals output from the at least two frequency dividers.

22. The frequency synthesizer of claim 18, wherein the clock generator is a phase-locked loop.

23. A frequency synthesizer, comprising:

the semiconductor device of claim 1, the phase offset unit including a phase-locked loop generating a plurality of output clock signals having fixed phase differences from the reference clock signal and a selector sequentially outputting at least one of the plurality of output clock signals based on a frequency of P in response to a count signal and the frequency dividing unit generates the first feedback clock signal by dividing the frequency of a clock signal received from the selector by K;

a sigma-delta modulator operating in synchronization with a frequency clock signal with a higher frequency than the reference clock signal, and generating a clock signal in response to a control signal; and a counter generating the count signal in response to the clock signal.

24. The frequency synthesizer of claim 23, wherein the counter is a down counter which maintains the value of the count signal if the clock signal is at a first logic level and decrements the count signal if the clock signal is at a second logic level.

25. The frequency synthesizer of claim 23, wherein the frequency of P is obtained from the output clock signal received from the selector.

26. The frequency synthesizer of claim 23, wherein the frequency dividing unit includes at least two frequency dividers which are connected in series to divide the frequency of the output clock signal from the selector, where the product of division ratios of the frequency dividers is K, and wherein the frequency clock signal with which the sigma-delta modulator is synchronized is one of a plurality of clock signals output from the at least two frequency dividers.

27. The frequency synthesizer of claim 26, wherein the frequency dividing unit comprises:

a first frequency divider dividing the frequency of the output clock signal from the selector by a division ratio equal to M, where M is an integer; and a second frequency divider dividing the frequency of a clock signal output from the first frequency divider by a division ratio equal to R, where R is an integer, wherein K is the product of R and M, and the frequency clock signal with which the sigma-delta modulator is synchronized is output from the first frequency divider.

28. A spread spectrum clock generator, comprising:

a plurality of frequency dividers which are connected in series; and a selector selecting and outputting one of a plurality of output clock signals, each of the plurality of output clock signals having a different phase difference with respect to a reference clock signal, in response to at least one output from one or more of the plurality of frequency dividers, wherein the at least one output from one or more of the plurality of frequency dividers a clock signal of which frequency is higher than that of the reference clock signal, wherein the selector sequentially selects and outputs one of the plurality of the output clock signals at a lower frequency than that of the plurality of output clock signals.

29. The spread spectrum clock generator of claim 28, further comprising:

a sigma-delta modulator generating a scale control signal in response to the at least one output of the plurality of frequency dividers, wherein the selector operates in response to the scale control signal.

30. The spread spectrum clock generator of claim 29, further comprising:

a counter generating a counter signal in response to the scale control signal, wherein the selector operates in response to the count signal.

31. The spread spectrum clock generator of claim 28, further comprising:

a multi-phase voltage-controlled oscillator outputting the plurality of output clock signals.

* * * * *